US007190625B2

(12) United States Patent
Keeth

(10) Patent No.: US 7,190,625 B2
(45) Date of Patent: Mar. 13, 2007

(54) METHOD AND APPARATUS FOR DATA COMPRESSION IN MEMORY DEVICES

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/217,618

(22) Filed: Aug. 31, 2005

(65) Prior Publication Data

US 2005/0286325 A1    Dec. 29, 2005

Related U.S. Application Data

(60) Division of application No. 10/879,925, filed on Jun. 28, 2004, now Pat. No. 6,999,361, which is a division of application No. 09/964,113, filed on Sep. 25, 2001, now Pat. No. 6,819,611, which is a continuation of application No. 09/139,838, filed on Aug. 25, 1998, now Pat. No. 6,295,618.

(51) Int. Cl.
G11C 7/00    (2006.01)

(52) U.S. Cl. .................. 365/201; 365/189.07; 365/190; 365/202

(58) Field of Classification Search ................ 365/201, 365/190, 189.07, 202
See application file for complete search history.

(56) References Cited

U.S. PATENT DOCUMENTS 4,991,139 A    2/1991 Takahashi et al. .......... 365/201

(Continued)

FOREIGN PATENT DOCUMENTS

| EP | 0 283 906 A1 | 9/1988 |
|----|--------------|--------|
| EP | 0 828 252 A2 | 3/1998 |
| EP | 0 840 328 A2 | 5/1998 |
| JP | 01042100 A | 2/1989 |
| JP | 409063296 A * | 3/1997 |
| JP | 09265775 A | 10/1997 |

OTHER PUBLICATIONS

Descriptive literature entitled, "400MHz SLDRAM, 4M×16 SLDRAM Pipelined, Eight Bank, 2.5 V Operation," SLDRAM Consortium Advance Sheet, published throughout the United States, pp. 1-22.

(Continued)

*Primary Examiner*—Viet Q. Nguyen
(74) *Attorney, Agent, or Firm*—Dorsey & Whitney, LLP

(57) ABSTRACT

A test circuit for a memory device having a pair of arrays each of which includes a plurality of memory cells arranged in rows and columns. A pair of complementary digit lines is provided for each column of each array. The digit lines are selectively coupled to a pair of I/O lines for each array which are, in turn, coupled to a pair of complementary data lines. The data lines are coupled to respective inputs of a DC sense amplifier, one of which is provided for each array. A multiplexer connects the pair of I/O lines for either one of the arrays to the data lines in a normal operating mode. Thus, in the normal operating mode, data are selectively coupled to the inputs of the DC sense amplifier from the complementary digit lines for an addressed column. In a test mode, the multiplexer connects the I/O lines for both arrays to the data lines to compress the data from the two arrays. Combinatorial logic then determines if both of the data lines have the same logical value, indicating disagreement between the data from the memory arrays that may indicate the presence of a defective memory cell in one or the other array. Thus, in the test mode, data are simultaneously coupled to the inputs of the DC sense amplifier from respective digit lines coupled to two different memory cells, thereby increasing the rate at which background data that has been written to the arrays can be read from the arrays.

5 Claims, 6 Drawing Sheets

U.S. PATENT DOCUMENTS

| | | | | |
|---|---|---|---|---|
| 5,029,330 | A | 7/1991 | Kajigaya | 365/201 |
| 5,124,589 | A | 6/1992 | Shiomi et al. | 307/465 |
| 5,148,398 | A | 9/1992 | Kohno | 365/201 |
| 5,150,325 | A | 9/1992 | Yanagisawa et al. | 365/177 |
| 5,179,537 | A | 1/1993 | Matsumoto | 365/201 |
| 5,185,722 | A | 2/1993 | Ota et al. | 365/201 |
| 5,185,744 | A * | 2/1993 | Arimoto et al. | 714/719 |
| 5,191,555 | A | 3/1993 | Tabacco et al. | 365/230.08 |
| 5,268,639 | A | 12/1993 | Gasbarro et al. | 324/158 R |
| 5,289,415 | A | 2/1994 | DiMarco et al. | 365/190 |
| 5,305,272 | A | 4/1994 | Matsuo et al. | 365/208 |
| 5,345,422 | A | 9/1994 | Redwine | 365/189.09 |
| 5,440,524 | A | 8/1995 | Devanney | 365/230.06 |
| 5,451,898 | A | 9/1995 | Johnson | 327/563 |
| 5,475,692 | A * | 12/1995 | Hatano et al. | 714/719 |
| 5,488,321 | A | 1/1996 | Johnson | 327/66 |
| 5,519,661 | A | 5/1996 | Miura | 365/205 |
| 5,557,573 | A | 9/1996 | McClure | 365/201 |
| 5,561,636 | A * | 10/1996 | Kirihata et al. | 365/201 |
| 5,610,866 | A | 3/1997 | McClure | 365/201 |
| 5,621,340 | A | 4/1997 | Lee et al. | 327/65 |
| 5,629,943 | A | 5/1997 | McClure | 714/718 |
| 5,654,924 | A * | 8/1997 | Suzuki et al. | 365/189.05 |
| 5,668,774 | A | 9/1997 | Furutani | 365/233 |
| 5,684,750 | A | 11/1997 | Kondoh et al. | 365/205 |
| 5,708,607 | A | 1/1998 | Lee et al. | 365/189.05 |
| 5,745,420 | A | 4/1998 | McClure | 365/201 |
| 5,754,557 | A | 5/1998 | Andrewartha | 714/718 |
| 5,770,964 | A * | 6/1998 | Suma | 327/328 |
| 5,809,038 | A | 9/1998 | Martin | 371/21.2 |
| 5,835,427 | A | 11/1998 | McClure | 365/201 |
| 5,859,804 | A * | 1/1999 | Hedberg et al. | 365/201 |
| 5,923,594 | A | 7/1999 | Voshell | 365/189.05 |
| 5,935,263 | A * | 8/1999 | Keeth et al. | 714/718 |
| 5,953,266 | A | 9/1999 | Shore | 165/200 |
| 5,956,279 | A | 9/1999 | Mo et al. | 365/201 |
| 5,959,911 | A | 9/1999 | Krause et al. | 365/201 |
| 5,959,921 | A | 9/1999 | Manning et al. | 365/208 |
| 5,959,930 | A | 9/1999 | Sakurai | 365/230.03 |
| 6,005,816 | A | 12/1999 | Manning et al. | 365/208 |
| 6,032,274 | A | 2/2000 | Manning | 714/718 |
| 6,043,562 | A | 3/2000 | Keeth | 257/776 |
| 6,055,654 | A | 4/2000 | Martin | 714/719 |
| 6,058,056 | A | 5/2000 | Beffa et al. | 365/201 |
| 6,067,651 | A | 5/2000 | Rohrbaugh et al. | 714/738 |
| 6,079,037 | A | 6/2000 | Beffa et al. | 714/720 |
| 6,141,276 | A | 10/2000 | Mullarkey et al. | 365/203 |
| 6,295,618 | B1 * | 9/2001 | Keeth | 714/718 |
| 6,301,144 | B1 | 10/2001 | Yoshida et al. | 365/63 |
| 6,301,169 | B1 | 10/2001 | Kikuda et al. | 365/201 |
| 6,324,118 | B1 | 11/2001 | Ooishi | 365/233 |
| 6,330,200 | B2 | 12/2001 | Ooishi | 365/201 |
| 6,522,598 | B2 | 2/2003 | Ooishi | 365/233 |
| 6,650,583 | B2 | 11/2003 | Haraguchi et al. | 365/201 |
| 6,762,617 | B2 | 7/2004 | Iwase et al. | 326/11 |
| 6,819,611 | B2 * | 11/2004 | Keeth | 365/205 |
| 6,987,702 | B2 | 1/2006 | Keeth | 365/201 |
| 6,999,361 | B2 * | 2/2006 | Keeth | 365/201 |
| 2004/0240284 | A1 | 12/2004 | Keeth | 365/201 |

OTHER PUBLICATIONS

"Draft Standards for a High-Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1-55.

Ishibashi, K. et al., "A 6-ns 4Mb CMOS SRAM with Offset-Voltage-Insensitive Current Sense Amplifiers," IEEE Journal of Solid-State Circuits, vol. 30, No. 4, Apr. 1995, pp. 480-486.

Kuroda, T. et al., "Automated Bias Control (ABC) Circuit for High-Performance VLSI's," IEEE Journal of Solid-State Circuits, vol. 27, No. 4, Apr. 1992, pp. 641-648.

Nagai, T. et al., "A 17-ns 4-Mb CMOS DRAM," IEEE Journal of Solid-State Circuits, vol. 26, No. 11, Nov. 1991, pp. 1538-1543.

Taguchi, M. et al., "A 40-ns 64-Mb DRAM with 64-b Parallel Data Bus Architecture," IEEE Journal of Solid-State Circuits, vol. 26, No. 11, Nov. 1991, pp. 1493-1497.

Taguchi M. et al., "A 40ns 64Mb DRAM with Current-Sensing Data-Bus Amplifier," ISSCC Digest of Technical Papers, 1991, TAM 6.5.

* cited by examiner

METHOD AND APPARATUS FOR DATA COMPRESSION IN MEMORY DEVICES

CROSS-REFERENCE TO RELATED APPLICATION

This application is a divisional of pending U.S. patent application Ser. No. 10/879,925, filed Jun. 28, 2004 which is a divisional of U.S. application Ser. No. 09/964,113, filed Sep. 25, 2001, now U.S. Pat. No. 6,819,611, which is a continuation of U.S. application Ser. No. 09/139,838, filed Aug. 25, 1988, now U.S. Pat. No. 6,295,618.

TECHNICAL FIELD

This invention relates to integrated circuit memory devices, and, more particularly, to a method and apparatus for reading data from memory devices in a compressed manner to expedite testing of memory devices.

BACKGROUND OF THE INVENTION

Integrated circuits are extensively tested both during and after production and, in some cases, routinely during use after they have been installed in products. For example, memory devices, such as dynamic random access memories ("DRAMs"), are tested during production at the wafer level and after packaging, and they are also routinely tested each time a computer system using the DRAMs executes a power up routine when power is initially applied to the computer system. DRAMs are generally tested by writing known data to each location in the memory, reading data from each memory location and then determining if the read data matches the written data. As the capacity of DRAMs and other memory devices continues to increase, the time required to write and then read data from all memory locations continues to increase, even though memory access times continue to decrease.

Various proposals have been made to decrease the time required to test memory devices, such as DRAMs. The time required to write known data to memory devices has been reduced by such approaches as simultaneously writing the same data to each column of each array in the memory device one row at a time. Other approaches include internal circuitry for transferring data from each column of one row to the next without requiring the memory to be addressed. These approaches have reduced the time required to write known data or a known pattern of data to the memory array.

Solutions have also been proposed for reducing the time required to read data from memory devices so that the data can be compared to the data written to the memory devices. One approach to solving the problem of excessive read times relies on data compression in which data from a direct current sense amplifier for one memory array are internally compared to the data from a sense amplifier of a different memory array. Simultaneously reading data from different memory locations in two different arrays has significantly reduced the time required to read data from memory devices for test purposes. However, combining data from multiple sense amplifiers requires the addition of circuitry and conductors to couple the outputs of the multiple sense amplifiers to comparison circuitry. As the circuit features of semiconductor devices become more densely packed, there is less space available to route conductors from each sense amplifier to a single location and to provide additional circuitry to combine the outputs of the direct current sense amplifiers.

There is therefore a need to be able to read data from a memory device in a compressed form to reduce testing time that can be implemented on integrated circuits having very densely packed circuit features.

SUMMARY OF THE INVENTION

In accordance with one aspect of the present invention, a test circuit is included in a memory device having at least one array or bank of memory cells arranged in rows and columns, a pair of complementary digit lines for each column and a direct current sense amplifier that couples data from a digit line selected by a column address to an external data terminal of the memory device. In accordance with one aspect of the invention, the test circuit includes a direct current sense amplifier that also provides a wired-OR function, combining data from several digit lines to one set of complementary I/O lines. When data from one memory cell differs from data from another cell and these data are being combined, both of the complementary I/O lines are low, and a detector circuit produces a "fail" signal. As a result, data can be read from the array in compressed fashion, e.g., from two columns at a time, thereby increasing the rate at which the memory array can be tested after background data have been written to the array. Although the memory device may have only a single memory array, it may also have multiple arrays, in which case columns from different arrays may be coupled to the inputs of a DC sense amplifier in the test mode. The coupling between the inputs of the DC sense amplifier and the digit lines is preferably through a pair of data lines coupled to the inputs of the DC sense amplifier, a pair of I/O lines for each of the arrays to which the digit lines of an addressed column are connected and a multiplexer selectively coupling two of the I/O lines to the data lines.

In accordance with an aspect of the invention, the test circuit may be used in a memory device that is connected to a test system. In such case, the test system may first write a known pattern of background data to the array followed by reading data from pairs of different columns of the memory device, as explained above. The read data are then examined to determine if the read data correspond to the pattern of background data written to the array, thereby providing an indication of whether the memory device is operating properly.

DETAILED DESCRIPTION OF THE INVENTION

Figure 1:
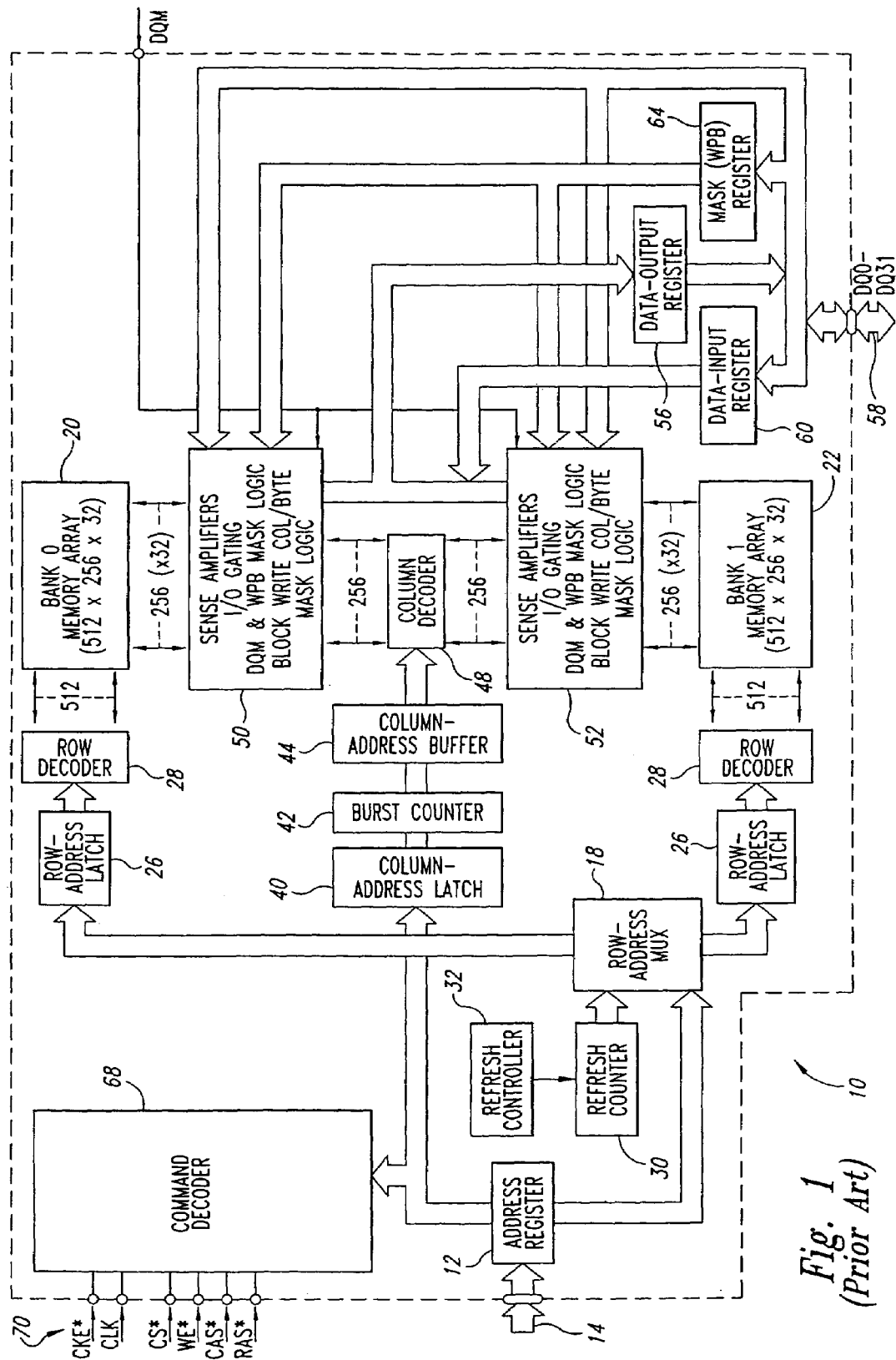
FIG. 1 is a simplified block diagram of a conventional memory device that may use an embodiment of a test circuit in accordance with the present invention.

An embodiment of a memory device that can advantageously use an embodiment of a test circuit in accordance with the present invention is illustrated in FIG. 1. The memory device shown in FIG. 1 is a synchronous dynamic random access memory ("SDRAM") 10, although the test circuit may also be used in other DRAMs and other memory devices. The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22, depending upon the state of a bank address bit forming part of the row address. Associated with each of the memory banks 20, 22 is a respective row address latch 26, which stores the row address, and a row decoder 28, which applies various signals to its respective memory bank 20 or 22 as a function of the stored row address. The row address multiplexer 18 also couples row addresses to the row address latches 26 for the purpose of refreshing the memory cells in the memory banks 20, 22. The row addresses are generated for refresh purposes by a refresh counter 30, which is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address that is stored in the column-address latch. In either case, the column address buffer 44 applies a column address to a column decoder 48, which applies various column signals to respective sense amplifiers and associated column circuitry 50, 52 for the respective memory banks 20, 22.

Data to be read from one of the memory banks 20, 22 are coupled to the column circuitry 50, 52 for one of the memory banks 20, 22, respectively. The data are then coupled to a data output register 56, which applies the data to a data bus 58. Data to be written to one of the memory banks 20, 22 are coupled from the data bus 58 through a data input register 60 to the column circuitry 50, 52 and then are transferred to one of the memory banks 20, 22, respectively. A mask register 64 may be used to selectively alter the flow of data into and out of the column circuitry 50, 52, such as by selectively masking data to be read from the memory banks 20, 22.

The above-described operation of the SDRAM 10 is controlled by a command decoder 68 responsive to high level command signals received on a control bus 70. These high level command signals, which are typically generated by a memory controller (not shown in FIG. 1), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 68 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

It will be appreciated that while this discussion mentions only two memory banks 20, 22, four, eight etc. memory banks 20, 22 may be coupled together to provide a greater degree of data compression. It will also be appreciated that, while this discussion is in terms of compressing data from multiple memory banks, data from multiple columns (or rows) within one memory bank may be compressed in a similar manner. In one embodiment, the memory cells providing the data that are compressed are also memory cells that would be replaced as a group by rows or columns of redundant or spare memory cells (not illustrated). In this embodiment, there is no need to test the memory banks 20, 22 individually because, when a memory cell at one location is replaced with a first redundant memory cell, a corresponding memory cell in another location will be automatically replaced by a second redundant memory cell.

In another embodiment, when testing determines from the compressed data that a memory cell in at least one of the memory banks 20, 22 is defective, individual testing of the memory cells in each memory bank 20, 22 allows more precise identification of the defective memory cell without substantial compromise of testing speed.

Figure 2:
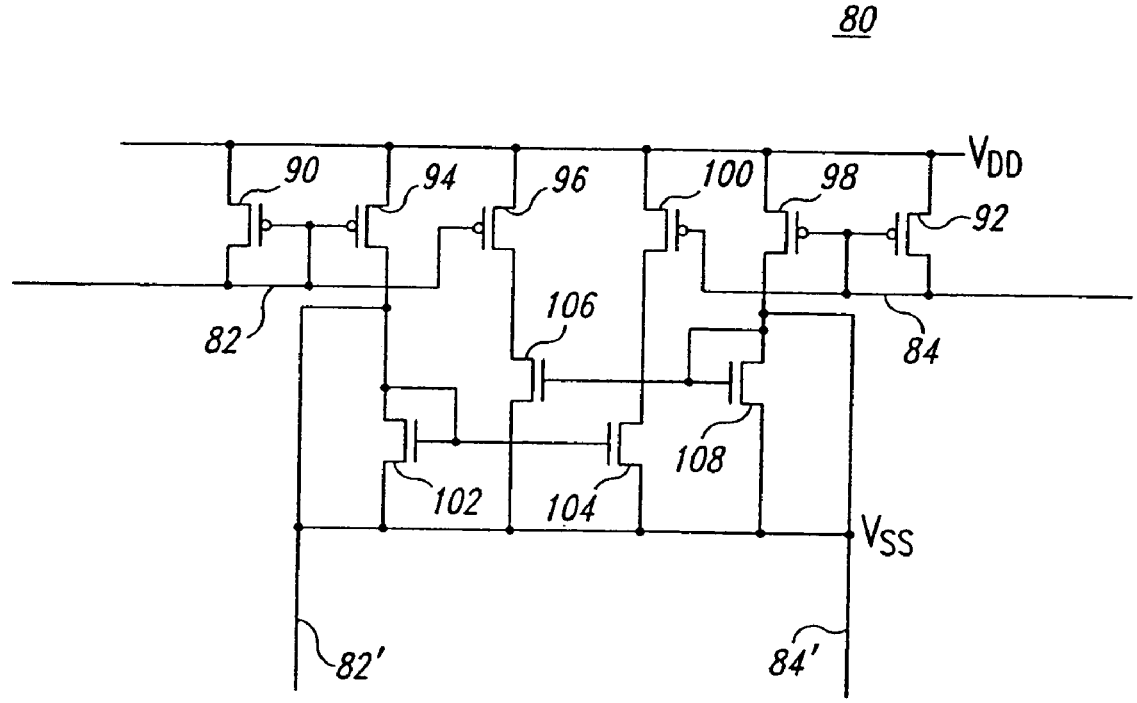
FIG. 2 is a simplified schematic diagram of a prior art DC sense amplifier than can be used with an embodiment of the present invention.

FIG. 2 is a simplified schematic diagram of a DC sense amplifier 80 that can be used with an embodiment of the present invention. The DC sense amplifier 80 is of a type described in "A 40-ns 64-Mb DRAM with 64-b Parallel Data Bus Architecture" by M. Taguchi et al., *IEEE Journal of Solid State Circuits*, Vol. 26, No. 11, November 1991 and includes inputs 82, 84' coupled to PMOS transistors 90 and 92, each having a source and gate coupled to a respective one of the inputs 82, 84. The transistor 90 is coupled to transistors 94, 96 in a current mirror configuration that provides a first current gain $\alpha_1$ for a signal current $I_1$ on the input 82. The transistor 92 is coupled to transistors 98, 100 in a current mirror configuration also providing the first current gain $\alpha_1$ for a signal current $I_2$ on the input 84.

NMOS transistors 102 and 104 form another current mirror amplifier having a current gain $\alpha_2$. An output current $I_{OUT}$ on the output 82' is thus $I_{OUT} = \alpha_1 I_1 - \alpha_1 \alpha_2 I_2$, and an output current $I_{OUT}*$ on the output 84' is described similarly, but with $I_1$ and $I_2$ interchanged. This type of DC sensing amplifier 80 provides high current sensitivity, which is advantageous when the added capacitance of additional digit lines and I/O lines is coupled to the inputs 82, 84. This type of direct current sense amplifier 80 also biases the inputs 82, 84 towards Vcc. As a result, a wired-OR function may be realized by simply coupling two or more open-drain FETs to one of the inputs 82, 84 to the DC sense amplifier 80.

Figure 3:
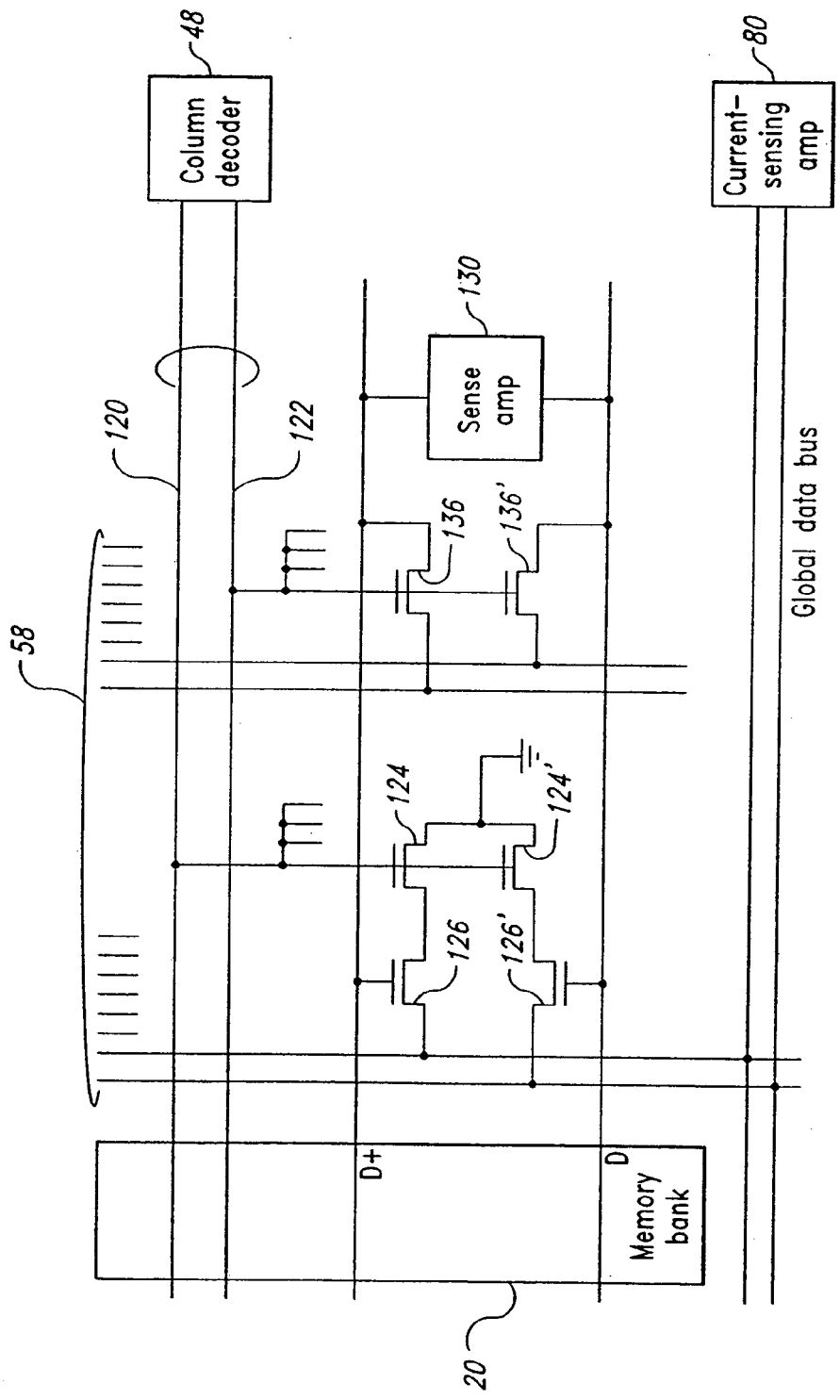
FIG. 3 is a simplified schematic diagram of a portion of a memory device in accordance with an embodiment of the present invention.

FIG. 3 is a simplified schematic diagram of a portion of a memory device 10 in accordance with an embodiment of the present invention. In operation, the column decoder 48 selects a column by activating either a read line 120 or a write line 122. The read line 120 is coupled to gates of isolation transistors 124, 124'. The isolation transistors 124, 124' have sources coupled to ground and each has a drain coupled to a source of one of digit line read transistors 126, 126'. The digit line read transistors 126, 126' include gates coupled to digit lines D+ and D, respectively. As a result, a sense amplifier 130 (FIG. 4) can read data from a memory cell (not shown) in the memory bank 20 20 through the digit lines D, D+, and couple the data from the memory cell to the data bus 58. Similarly, data from the data bus S8 can be written to the memory cell when the column decoder 48 activates the write line 122 to turn on the write isolation transistors 136, 136'.

Because the digit line read transistors 126, 126' have drains coupled to the data bus 58, and the DC current sensing amplifier 80 of FIG. 2 supplies a pull-up bias at the inputs 82, 84, which are also coupled to the data bus S8, drains of multiple digit line read transistors 126, 126' corresponding to different memory cells can be coupled together to one of the inputs 82, 84 to provide a wired-OR function. As a result, data from multiple memory cells may be compressed, allowing multiple memory cells to be read simultaneously.

Figure 4:
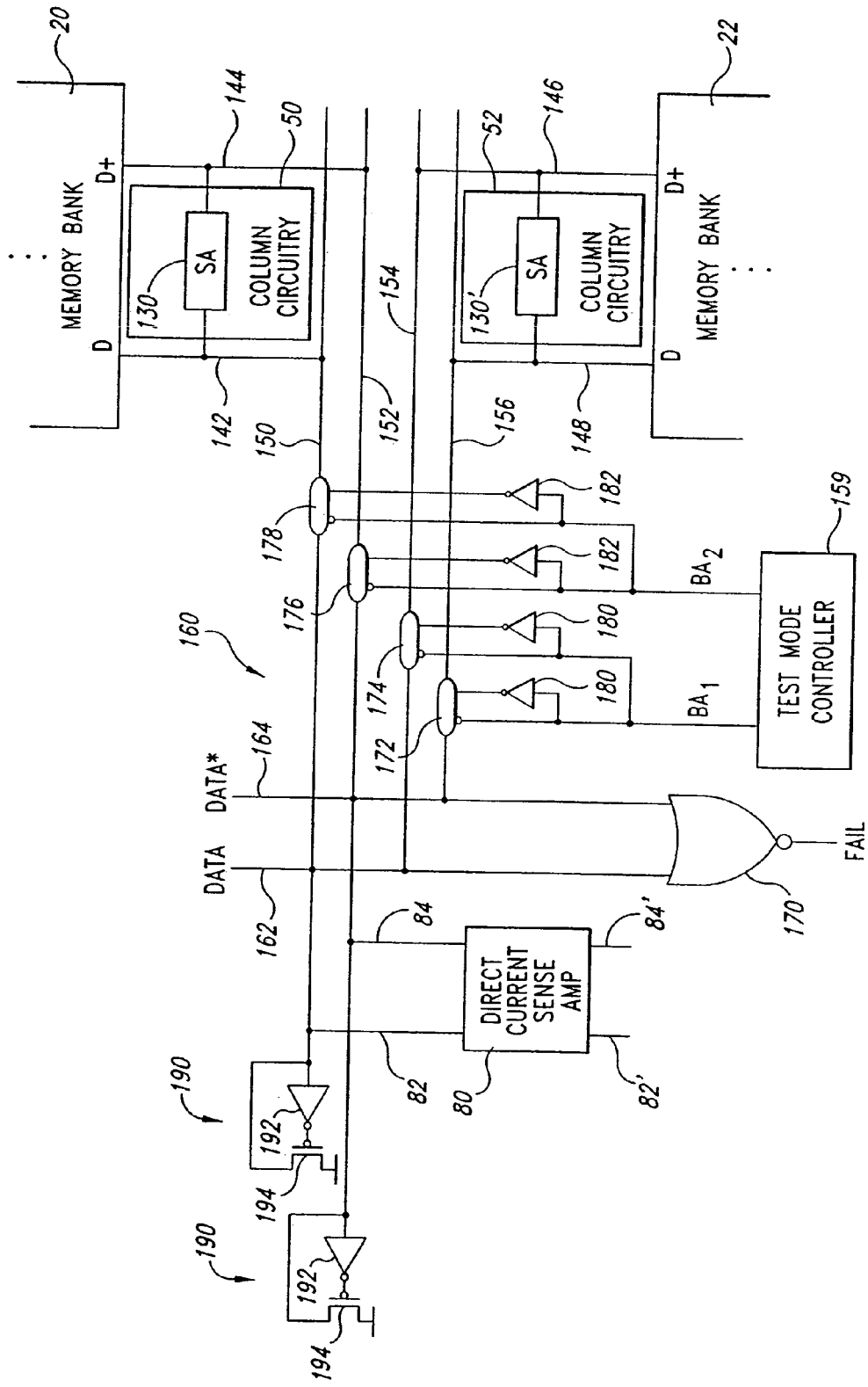
FIG. 4 is a block diagram of a portion of the memory device of FIG. 1 including a test circuit in accordance with an embodiment of the present invention.

FIG. 4 is a block diagram of a portion of the memory device 10 of FIG. 1 including a test circuit 140 in accordance with an embodiment of the present invention. To understand the inventive test circuit 140, it is best to have an understanding of a portion of the circuitry conventionally used in the column circuitry 50, 52 in the SDRAM 10 of FIG. 1. With reference to FIG. 4, the column circuitry 50, 52 for each of the memory banks 20, 22 typically includes one of the sense amplifiers 130, 130' for each column in each memory bank 20, 22, respectively. The sense amplifiers 130, 130' each receive signals from, and apply signals to, a pair of complementary digit lines 142, 144 and 146, 148, respectively. Thus, for example, when data being read from a column in memory bank 20 is "1," the digit line 142 will be at a logic "1" and the complementary digit line 144 will be at a logic "0."

As mentioned above, many sense amplifiers 130, 130' are provided for each array 20, 22, respectively. In one embodiment, the digit lines 142, 144 and 146, 148 of each sense amplifier 130, 130' are selectively applied to complementary I/O lines 150, 152 and 154, 156 by column addressing circuitry 160. There is one pair of I/O lines 150, 152 and 154, 156 for each segment of the arrays 20, 22, respectively. In operation, when the column for which the sense amplifier 130 is provided is addressed, the digit lines 142, 144 are coupled to the I/O lines 150, 152, respectively, by the column addressing circuitry in the column circuitry 50 (see FIGS. 1 and 3). Similarly, when the column to which the sense amplifier 130' is coupled is addressed, the digit lines 146, 148 are coupled to the complementary I/O lines 154, 156, respectively, by the column addressing circuitry in the column circuitry 52 (FIG. 1).

In response to signals from a test mode controller 159, the column select circuitry 160 selectively couples the I/O lines 150–156 to a pair of complementary data lines 162, 164 that in turn are coupled to inputs of a NOR gate 170. The column select circuitry 160 is formed by multiplexers 172, 174, 176 and 178 and inverters 180 and 182. The sense amplifiers 130, 130' of FIGS. 1 and 4 have previously been turned on. Each line of each pair of I/O lines 150–156 is thus at a voltage of either Vcc or ground and is coupled to an input of multiplexers 172–178.

In another embodiment, only the columns of interest are turned on. As a result, the column addressing circuitry 160 is not required, and I/O lines 150 and 154 are both coupled to the data line 162. Similarly, the I/O lines 152 and 156 are both coupled to the data line 164.

As a result, in either embodiment, a wired-OR function is realized when, e.g., I/O lines 150, 154 are coupled to a common node that includes a pull-up current source, such as the inputs 82, 84 to the DC sense amplifier 80 of FIG. 2. Thus, when the data being read out from the memory banks 20, 22 differ, both of the data lines 162, 164 will be at logic "0." The data lines 162, 164 are, in turn, coupled to the inputs 82, 84 of the DC sense amplifier 80 having complementary output terminals 82', 84' that are normally coupled to or part of the data output register 56 (FIG. 1). When both of the data lines 162, 164 are at logic "0," this is detected by the NOR gate 170, and a logic "1" on the line FAIL coupled to an output of the NOR gate 170 indicates that one of the memory banks 20, 22 includes a defective memory cell.

In a normal mode of operation, the column decoder 48 selects only one column at a time. In a test mode of operation in accordance with an embodiment of the invention, multiple columns are active at the same time. In one embodiment, a wired-OR function compresses data from both memory banks 20, 22 by coupling both sets of I/O lines 150, 152 and 154, 156 to the DC sense amplifier 80. When the same data have been written to both memory banks 20, 22, but the read data from the two memory banks 20, 22 are different, both data lines 162, 164 will go to logic "0."

It will be appreciated that combinatorial logic may be used to detect failed memory cells, even in memories having very wide data paths that may be coupled to other circuitry in a manner different that that shown in FIG. 4, e.g., not necessarily having I/O lines and data lines.

In one embodiment, weak latches 190 are coupled to each of the data lines 162, 164. A weak latch 190 is provided by coupling the input of an inverter 192 to one of the data lines 162, 164 and the output of that inverter 192 to the gate of a PMOS transistor 194 having a source coupled to ground and a drain coupled to that data line 162, 164. The weak latches 190 may be set or reset in response to changes in the data presented on the data lines 162, 164. The PMOS transistor 194 allows the latch 190 to be set or reset by signal sources having more robust signal assertion capabilities.

In operation, the SDRAM 10 is tested by first writing known data to the memory banks 20, 22 by conventional means. The data may be written by addressing individual memory cells or by using conventional approaches for writing data to the memory banks 20, 22 for test purposes, as explained above. For example, a logic "1" may be written to each memory cell in the memory banks 20, 22 so that when the data are read, the non-complementary digit lines 144, 146 will be logic "1" and the complementary digit lines 142, 148 will be logic "0." Under these circumstances, the DC sense amplifier 80 will receive the same signals as when reading a logic "1" from a memory cell (i.e., D="1" and D*="0") thereby generating a logic "1" on its output terminal 82' and a logic "0" on its output terminal 84'. However, it will be understood that logic "0" may be written to all memory cells in the memory banks 20, 22, or data in some other pattern, such as a checkerboard pattern, may be written to the memory banks 20, 22. In any case, as long as the data are written to the memory banks 20, 22 in a known pattern, the compressed data applied to the DC sense amplifier 80 and the NOR gate 170 can provide an indication of whether the memory cells in the memory banks 20, 22 are operating properly. However, the data written to the memory banks 20, 22 must be selected so that, when the data is read from the memory banks 20, 22, the data and data* will be at complementary logic levels.

Figure 5:
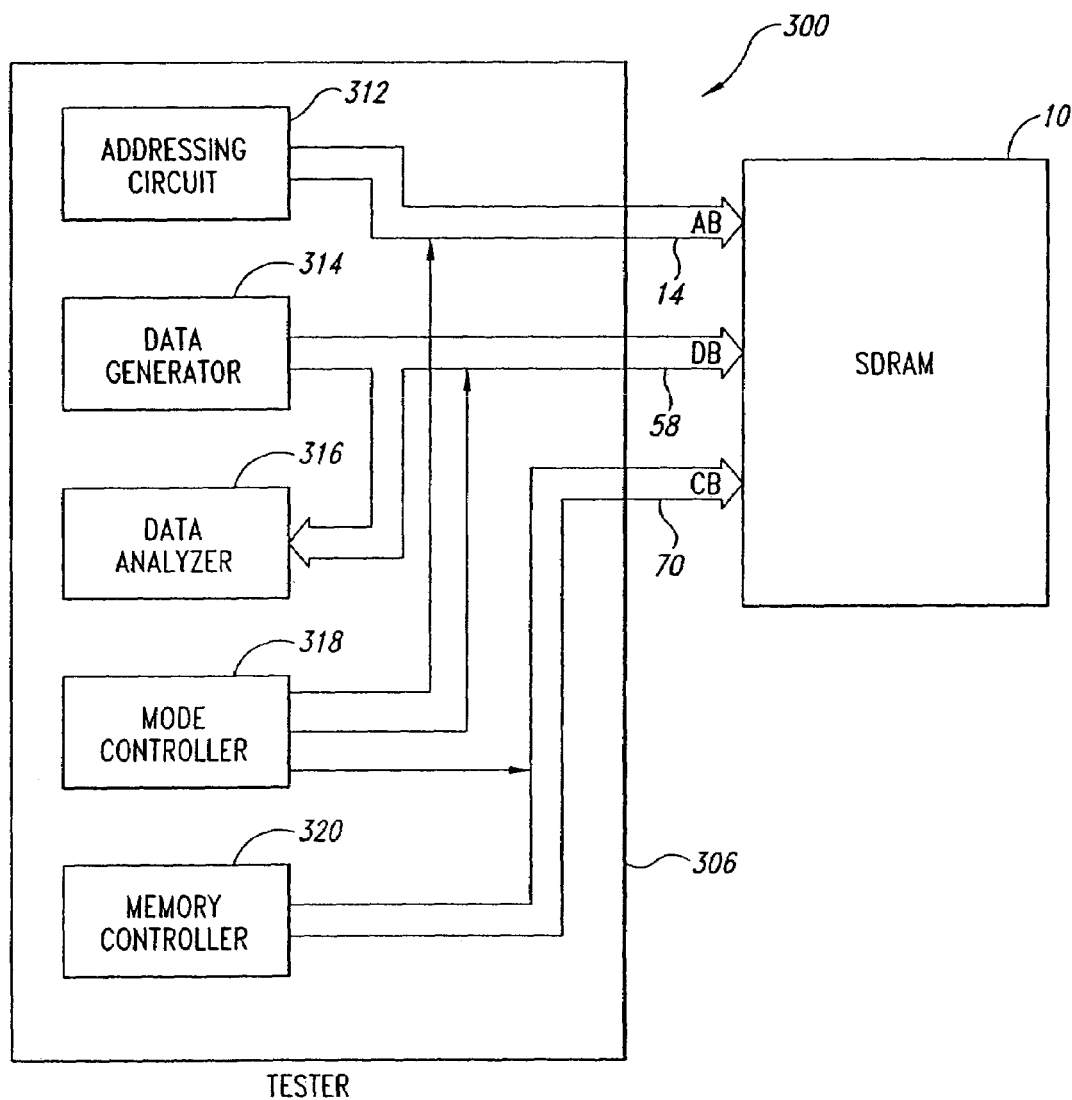
FIG. 5 is a block diagram of the memory device of FIGS. 1 and 4 used with a test system to determine whether the memory device is operating properly in accordance with embodiments of the present invention.

A testing system 300 for testing the SDRAM 10 containing the test circuit 140 of FIG. 4 is shown in FIG. 5, in accordance with an embodiment of the present invention. The SDRAM 10 is connected through its address bus 14, data bus 58 and control bus 70 to a tester 306. The tester 306 includes an addressing circuit 312 connected to the address bus 14, a data generator 314 connected to the data bus 58, a data analyzer 316 also connected to the data bus 58, a mode controller 318 connected to a plurality of externally accessible terminals of the SDRAM 10 in one or more of the buses 14, 58, 70, and a memory controller 320 providing control signals to the SDRAM 10 on the control bus 70.

In operation, the data generator 314 applies predetermined data to the data bus 58 while the addressing circuit 312 applies suitable addresses to the address bus 14 to cause the data on the bus 58 to be written into the SDRAM 10 under control of the memory controller 320. During this time, the mode controller 318 generates and applies combinations of signals to the external terminals of the SDRAM 10 to cause the test mode controller 132 to generate the bank addressing signals as desired. After data have been written to the memory banks 20, 22, the mode controller 318 generates a combination of signals to cause the test mode controller 159 (FIG. 4) to place the test circuitry 140 in the test mode. The addressing circuitry 312 then addresses the memory cells of the memory banks 20, 22 under control of the memory controller 320 to apply compressed data to the DC sense amplifier 80. The resulting data signals at the output terminals 82', 84' of the DC sense amplifier 80 are coupled through the data bus 58 to the data analyzer 316. The data analyzer 316 determines whether the data read from the SDRAM 10 corresponds to the data written to the SDRAM 10. Although the test system 300 is shown as being used to test an SDRAM 10, it will be understood that it may be used to test other types of DRAMs and other types of memory devices.

The addressing circuits 312, data generator 314, data analyzer 316, mode controller 318, and memory controller 320 can be implemented by a variety of means with relative ease by one skilled in the art. For example, these components can be implemented in software executed by a computer system. Alternatively, the addressing circuit 312 can be implemented by a counter that outputs incrementally increasing addresses. The data generator 314 can be implemented by a set of pull-up resistors that simply hold the lines of the data bus 58 at logic "1". The data analyzer 316 can be implemented by a latch that detects a predetermined logic level. The mode controller 318 can be implemented by a logic circuit that generates predetermined combinations of signals. The memory controller 320 can be implemented by a conventional memory controller. The tester 306 and its internal components are preferably controlled by a conventional computer system (not shown).

Figure 6:
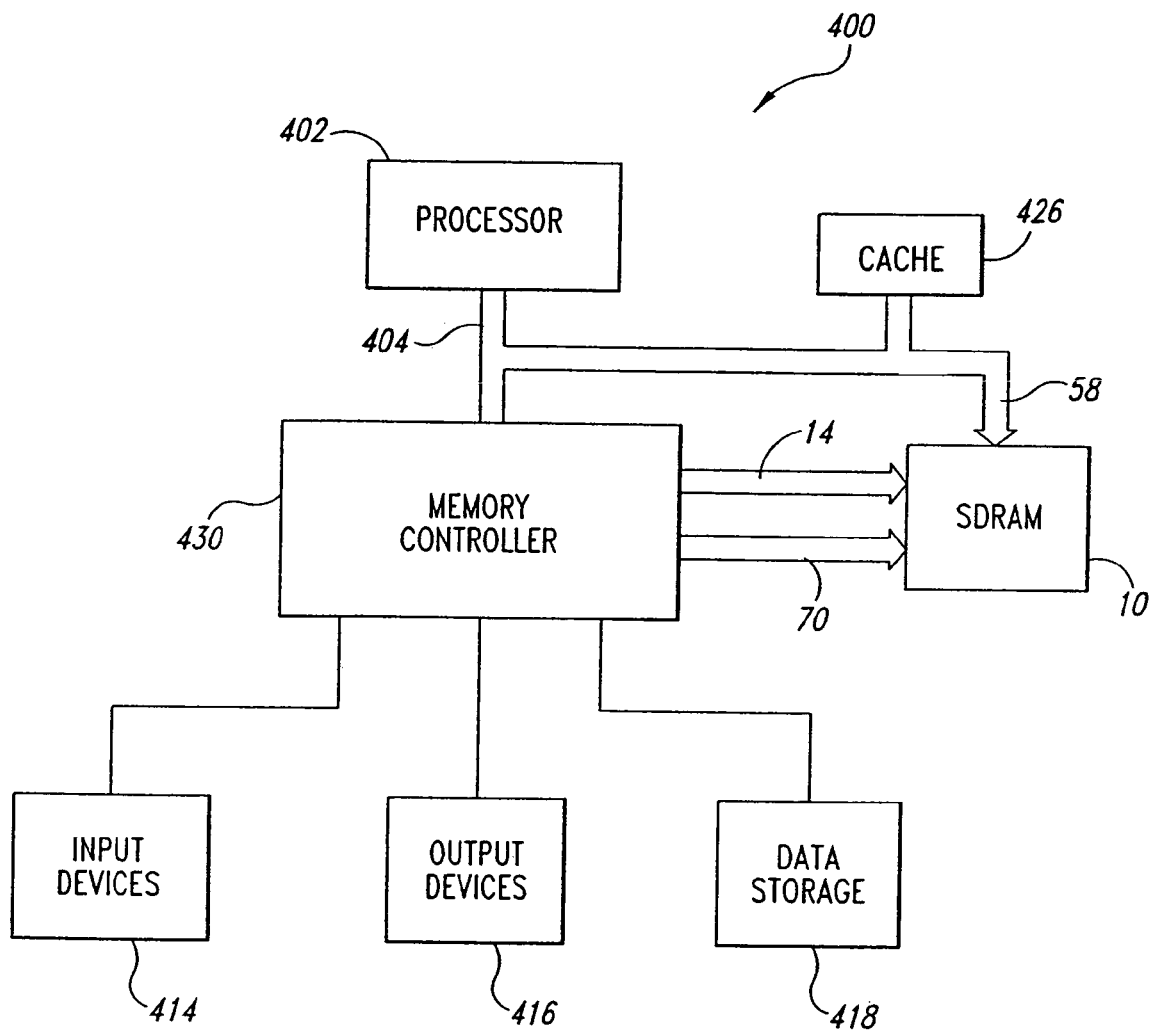
FIG. 6 is a block diagram of a computer system using the memory device of FIGS. 1 and 4 in accordance with an embodiment of the invention.

FIG. 6 is a block diagram of a computer system 400 which includes the SDRAM 10 of FIGS. 1, 3 and 4. The computer system 400 includes a processor 402 for performing various computing functions, such as executing specific software to perform specific calculations or tasks. The processor 402 includes a processor bus 404 that normally includes the address bus 14, the data bus 8, and the control bus. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to allow the processor 402 to store data or retrieve data from internal or external storage media (not shown). Examples of typical storage devices 418 include hard and floppy disks, tape cassettes and compact disk read-only memories (CD-ROMs). The processor 402 is also typically coupled to cache memory 426, which is usually static random access memory ("SRAM") and to the SDRAM 10 through a memory controller 430. The memory controller 430 normally includes the control bus 70 and the address bus 14 that is coupled to the SDRAM 10. The data bus 58 may be coupled to the processor bus 404 either directly (as shown), through the memory controller 430, or by some other means.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

The invention claimed is:

1. A method for testing multiple columns of memory concurrently, comprising:
    writing data to memory cells in the multiple columns of memory;
    biasing a pair of complementary data lines to a first voltage corresponding to a first logic state;
    concurrently coupling complementary digit lines in the multiple columns of memory to respective data lines in the pair of complementary data lines;
    coupling at least one of the data lines to a second voltage corresponding to a second logic state that is different from the first logic state in the event data from the memory cells in any of the multiple columns of memory are storing data that are different from the write data;
    detecting that at least one of the data lines is coupled to the second voltage; and
    generating an output signal having a logic state indicative of a pass-fail condition of the memory responsive to detecting that at least one of the data lines is coupled to the second voltage.

2. The method of claim 1 wherein the act of biasing a pair of complementary data lines to a first voltage corresponding to a first logic state comprises coupling the data lines to respective complementary inputs of a DC sense amplifier that are biased to the first voltage.

3. The method of claim 1 wherein the act of detecting that at least one of the data lines is coupled to the second voltage comprises detecting that both of the data lines are coupled to the second voltage.

4. The method of claim 3 wherein the act of generating an output signal having a logic state indicative of a pass-fail condition of the memory comprises performing a boolean NOR function on the logic levels corresponding to the voltages on the data lines.

5. The method of claim 1 wherein the act of concurrently coupling complementary digit lines in the multiple columns of memory to respective data lines in the pair of complementary data lines comprises coupling complementary digit lines in multiple columns of memory in at least two different banks of memory to respective data lines.

* * * * *